United States Patent [19]

Saito et al.

[11] Patent Number: 4,572,843
[45] Date of Patent: Feb. 25, 1986

[54] METHOD FOR PRODUCING A CAPACITOR WITH PRECISE CAPACITANCE

[75] Inventors: Masayuki Saito, Yokohama; Haruko Suzuki, Yokosuka; Hirosi Oodaira, Chigasaki, all of Japan

[73] Assignee: Kabushiki Kaisha Toshiba, Kawasaki, Japan

[21] Appl. No.: 697,260

[22] Filed: Feb. 1, 1985

[30] Foreign Application Priority Data

May 30, 1984 [JP] Japan .................................. 59-108568

[51] Int. Cl.$^4$ .......................... H01G 1/01; B05D 3/06; B05D 5/12
[52] U.S. Cl. ..................................... 427/53.1; 427/55; 427/56.1; 427/79
[58] Field of Search ........................ 427/53.1, 55, 56.1, 427/79

[56] References Cited

U.S. PATENT DOCUMENTS

| | | | |
|---|---|---|---|
| 2,321,587 | 6/1943 | Davie et al. | 427/79 |
| 3,451,813 | 6/1969 | Kinney et al. | 427/96 |
| 4,526,807 | 7/1985 | Auerbach | 427/53.1 |

Primary Examiner—Richard Bueker
Attorney, Agent, or Firm—Oblon, Fisher, Spivak, McClelland & Maier

[57] ABSTRACT

A method for producing a capacitor includes the steps of: forming on a dielectric layer formed on a first electrode, an insulating composition, e.g., an organic polymeric compound containing a metal powder or an organometallic compound as a metal source, which is rendered conductive upon heating by radiation; and locally and gradually heating the insulating composition layer so as to form a second conductive electrode while measuring an increase in a capacitance between a conductor end portion for measuring a capacitance and the first electrode. According to this method, a capacitor having a precise capacitance can be formed.

8 Claims, 7 Drawing Figures

METHOD FOR PRODUCING A CAPACITOR
WITH PRECISE CAPACITANCE

BACKGROUND OF THE INVENTION

1. Field of the Invention

The present invention relates to a method for producing a capacitor with a precise capacitance and, more particularly, to a method for producing a film capacitor which is directly formed on a circuit board.

2. Description of the Prior Art

Electronic components have recently become considerably compact in size and thin in thickness. This is a result of high integration of active elements and compact passive and functional elements.

For example, techniques for forming film resistors directly on a substrate have been proposed and carried out. These film resistors are formed in the following manner. A substrate is applied with a thick film paste containing ruthenium oxide as a major component or an organic thick film paste containing carbon as a major component. The resultant film is baked or subjected to a thin film forming technique such as deposition, sputtering or plating. In such film resistors, a mounting process required for chip components is not needed, resulting in a simple process and low cost.

Film capacitors using a thick film paste have been proposed. For example, a dielectric paste and a metal powder paste for an electrode are alternately printed and baked so as to form the film capacitor. However, a capacitance of the resultant capacitor changes slightly in accordance with a thickness of the paste and printing and baking conditions. Therefore, it is difficult to produce a capacitor having a designed capacitance.

This problem occurs not only with film capacitors, but also with normal chip capacitors which are influenced by the manufacturing process. Therefore, it is very difficult to obtain a designed capacitance.

In other words, only after the final step in the manufacture of these capacitors is completed, a capacitance thereof can be determined.

SUMMARY OF THE INVENTION

It is an object of the present invention to provide a method for producing a capacitor with a capacitance precisely corresponding to a designed value.

It is another object to provide a method for producing a film capacitor on a substrate while controlling a capacitance thereof.

According to the present invention, there is provided a method for producing a capacitor, comprising the steps of:

(1) forming a dielectric layer on a first electrode so as to expose an end portion of said first electrode;
(2) forming on said dielectric layer an insulating composition layer which can be rendered conductive by heating with heat waves;
(3) locally heating said insulating composition layer so as to form a conductor end portion for measuring a capacitance; and
(4) locally and gradually heating said insulating composition layer until a capacitance thereof reaches a predetermined value while measuring the capacitance between said exposed end portion of said first electrode and said conductor end portion for measuring the capacitance, thereby forming a second electrode which is conductive.

A capacitance measuring electrode is preferably formed on an insulating substrate so as to be separated from the first electrode and the dielectric layer formed thereon. The end portion of the capacitance measuring conductor can be formed on this electrode. In this case, the capacitance can be measured between the exposed end portion of the first electrode and the capacitance measuring electrode. The insulating composition layer must be formed on both the dielectric layer and the electrode for measuring the capacitance. When the electrode is formed so as to completely cover the dielectric layer, it can serve as a protection layer of the dielectric layer.

When the capacitance measuring electrode is not formed, the end portion of the capacitance measuring conductor can be formed on the dielectric layer of the insulating composition layer or on a region extending externally from the dielectric layer.

DETAILED DESCRIPTION OF THE PREFERRED EMBODIMENT

Figure 1:
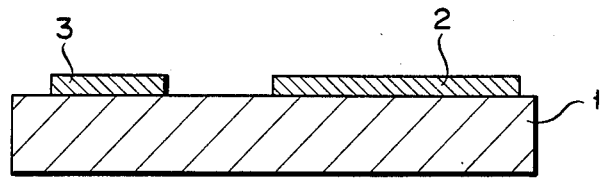
FIGS. 1 to 4 are schematic sectional views for explaining a method for producing a capacitor according to the present invention.

Insulating compositions to be rendered conductive by heating include an organic polymeric material containing a metal source, a thick film paste containing a metal oxide film such as ruthenium oxide and an organic binder, and an organic polymeric material which is carbonized by heating.

When an organic polymeric material containing a metal source such as a metal powder or an organometallic compound is subjected to heat, it is decomposed and evaporates. Thus, a metallic component in the organic polymeric material is left as a precipitate and welded to each other so as to form a conductor. The organic polymeric materials forming these compositions have film forming and insulating properties. For example, the organic polymeric material includes an epoxy resin, phenolic resin, phenoxy resin, polyvinyl chloride resin, acrylic resin, polyvinyl butyral resin, polyvinyl ketone resin, polyimide resin, polyolefin resin, polycarbonate resin, polyamide resin, melamine resin, styrene resin, and the like. An organic polymeric material used in the present invention is preferably easily decomposed by heat energy, and preferably cannot be carbonized during this heat decomposition. From this point of view, examples of a useful organic polymeric material include acrylic resins, e.g., polyacrylic acid, polymethyl acrylate, polyethyl acrylate, polybutyl acrylate, polymethyl methacrylate, polyethyl methacrylate, and polybutyl methacrylate; thermosetting acrylic resins such as a copolymer of a poly-functional acrylic compound, e.g., triethylene diacrylate, pentaerythritol triacrylate, with an acrylic resin; polyolefins, e.g., polyethylene and polypropylene; and paraffin wax. Furthermore, in view of heat resistance, humidity resistance, and adhesion properties with respect to the electrical parts, an acrylic resin, more particularly, polymethyl methacrylate and a copolymer thereof, the thermosetting acrylic resin and polyvinyl butyral are preferably used as polymeric materials.

The metal powder used as the metal source in the present invention includes powders of copper, nickel, aluminum, tungsten, molybdenum, titanium, gold, silver, platinum, iron and the like.

Generally, when a metal powder is used, bonding and sintering must be performed at high temperature and pressure. However, when a particle size of the powder is small, the metal powder can be easily sintered. Particularly, when optical energy is radiated on the composition in which the metal powder having a particle size of 2,000 Å or less is dispersed in an organic polymeric binder, an organic polymer therein is very easily decomposed by the heat and the metal powder contained therein is precipitated and welded to each other. When a powder having a large particle size is used (e.g., commercially available powders usually have particle sizes in the order of microns), the composition formed together with an organic resin may not have a sufficient insulation property. In particular, a sufficient breakdown voltage may not be obtained. Furthermore, when micropatterns having a pattern width of 20 μm or less are formed, it is difficult to form continuous patterns if the particle size exceeds 2,000 Å, resulting in disconnection and short-circuiting with an adjacent conductor. When a metal powder having a particle size exceeding 2,000 Å is used, the metal powder has a large heat capacity. Therefore, conversion of the insulating composition into the conductor by heating is undesirably slow.

Although the amounts of the metal powder and the organic polymeric material are not particularly limited, the composition containing these components and the composition layer formed therefrom must have the insulation property. Therefore, in order to keep a high insulation property of the insulating composition layer in the unheated state, the content of the metal powder is preferably 35% by volume or less of the total volume of the insulating composition. The content of the metal powder must be 5% by volume or more of the composition so that the composition has upon heating the conductivity sufficient for a capacitor electrode. The content of the metal powder is preferably 10 to 20% by volume.

An upper surface of the metal powder is easily oxidized by air. For this reason, when the metal powder is dispersed in the organic polymeric material, it can keep its insulation property. The metal powder can be preoxidized. In this case, when the composition is heated in a reducing atmosphere, a metal conductor can be formed by a reduction reaction. Even if the reducing atmosphere is not used, some organic polymeric materials may reduce oxides when they are decomposed.

An organometallic compound can be used as a metal source as well as the above-mentioned metal powders. An organic metallic compound is easily miscible with an organic polymeric material and provides better insulation than a metal powder. In addition, when the organic metallic compound is heated, an organic component is decomposed and evaporated so as to leave a conductor. The organometallic compound can be a high polymer. However, the organometallic compound having a high content of metal per unit molecule is most preferable. For example, when an organometallic compound having a long organic group bonded with a metal, (e.g., lauroyl and stearyl groups having a long chain is decomposed by optical energy), the metal content in the composition is undesirably lowered, resulting in a conductor pattern having a low conductivity. Therefore, the organic metallic compound preferably has a high metal content. An organic group which is difficult to carbonize and which has no cyclic structure, such as a phenyl group, is preferably used. In addition, since formation of a corrosive decomposition component is to be avoided, the organic group having no halogen atom is preferably used. A type of metal is not limited so long as it can form a conductor, but copper, nickel, aluminum, gold, silver and the like are preferably used. Furthermore, two types of organometallic compounds can be mixed.

The organometallic compound which can be utilized in the present invention includes metal formates, metal acetates, metal acrylates or methacrylates and polymers thereof, metal alkylates having carbon atoms of 1 to 5, metal alkoxylates having carbon atoms of 1 to 5, and the like.

When the organic polymeric material is modified so that it readily absorbs heat waves, fine patterns can be easily formed. Thus, when a resistor is formed, a line width thereof can be small, thereby obtaining high resistance. A method for modifying the organic polymeric material includes a method wherein the organic polymeric material is subjected to a heat treatment, at a temperature of 200° to 300° C. for 0.05 to 10 hours so as to be heat decomposed, thus generating a chromophore; a method wherein a dye, a pigment, e.g., carbon black, Benzidine Yellow, Rhodamine B Lake and the like, or black iron oxide which easily absorbs heat energy are added to an organic polymeric material; a method wherein a functional group which easily absorbs heat energy, primary to tertiary amine groups, nitro group and the like, is added to the organic polymeric material; a method wherein a functional compound which easily absorbs heat energy, e.g., imidazole compound, nitro compound, amine compound, and the like, is mixed with the organic polymeric material; a method wherein a coating material containing the above-mentioned dye or pigment is coated on the insulating composition layer, and the like. When any of these methods is performed, the insulation property of the organic polymeric material must be kept unchanged, and the organic polymeric material itself should not be converted into a resistor or conductor path.

In view of insulation property and formation of a good conductor path by heating, the organic compound chemically combining a metal is mixed with the organic polymeric material such that the total number of the metal atoms amounts to 0.1 to 20%, preferably 1 to 10% of the sum of the number of the atoms constituting the organic polymeric material, plus the number of the atoms constituting the organic compound chemically combining metal. The organic compounds combining a metal are decomposed by heating so as to liberate the metal, and the liberated metal is welded to each other, thereby forming a conductor.

In the case wherein the insulating composition is coated on a substrate, when the same component as that in the substrate is mixed therein, a difference in an expansion coefficient can be decreased, resulting in a high bonding strength.

Thick film pastes containing a metal oxide powder and an organic binder have already been known as a resistor forming material. As a metal oxide, $RuO_2$, $NiO$, $SnO_2$, $CrSiO_2$, $V_2O_5$, or $Fe_3O_4$ is used. An example of such a thick film paste is described in Japanese Patent Disclosure (Kokai) No. 49-21693 in which a thick film paste for forming a resistor contains $RuO_2$, $V_2O_5$ and a glass powder which are dispersed in an organic vehicle. When this thick film paste is used, conductivity which is sufficient to be used as a capacitor electrode is obtained by heating the paste. In addition, a resistor element can be simultaneously formed on the substrate together with the capacitor.

Furthermore, an organic polymeric material which increases conductivity by carbonizing by heating includes thermoplastic polymer, thermosetting polymer and a mixture thereof, e.g., polyimide, poly(amide-imide), polybenzimidazole, melamine bismaleimide triazine, polysulfone, polyphenylene sulfide, and the like. However, in view of stability overtime of the resistor element formed, an organic polymer containing 5% by weight or more of acrylonitrile is more preferably used. An acrylonitrile-based organic polymeric material includes, for example, a homopolymer or a copolymer of acrylonitrile, and a mixture thereof with a non-acrylonitrile-based polymer, including thermosetting and thermoplastic resins. Such an organic polymeric material can contain fine particles (particle size of 50 Å to 10 $\mu$m) of a metal oxide such as $SiO_2$, $Al_2O_3$, and the like, in an amount up to 50% by weight of the total weight of the composition so as to allow uniform coating and to control the resistance of the composition when such an organic polymeric material is coated or printed on the substrate. In order to adjust the conductivity obtained by heating, the organic polymeric material can contain metal particles and/or metal ions of Cu or Ag, and the like. As an example of an organic polymeric material and a method of using thereof, in Japanese Patent Disclosure (Kokai) No. 55-14801 and No. 58-12392, a method in which an insulating polymer is locally heated, and a heated portion is carbonized to form a conductor path such as a resistor is disclosed.

According to a method of the present invention, the insulating composition is locally heated by heat waves to be converted into a conductor or to be rendered conductive. A laser beam or focused infrared rays can be used as a heat wave in the present invention. In order to form micropatterns and to convert the insulating composition into a conductor with high efficiency, a laser beam of small spot size is preferably used.

A preferred embodiment of the present invention will be described in detail with reference to the accompanying drawings.

As shown in FIG. 1, a first electrode 2 of a capacitor and a capacitance measuring electrode 3 are formed on an insulating substrate 1. The insulating substrate 1 can be any insulating ceramic substrate made of alumina ceramics, or any resin substrates made of paper phenol, glass epoxy, polyimide BT resin or the like. The electrodes 2 and 3 can be formed of a conductive material corresponding to the insulating substrate 1. When the insulating substrate 1 is made of alumina ceramics, a thick film conductor such as Ag-Pa, Au, Ag, Ag-Pu, Cu or the like is preferably used. Alternatively, when a resin material such as glass epoxy is used as the substrate, the electrodes are formed by etching copper foil, or an organic thick film conductor is used.

Figure 2:
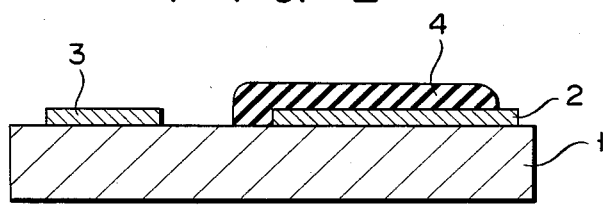

As shown in FIG. 2, a dielectric layer 4 is formed on the first electrode 2 by a conventional method. As a dielectric material for forming the dielectric layer 4, a known material can be used. For example, glass materials, such as lead glass, borosilicate glass, silica glass, Pyroceram and a mixture thereof can be used. Alternatively, ceramic dielectrics, e.g., $TiO_2$, $BaTiO_3$, $SrTiO_3$, $CaTiO_3$, $MgTiO_3$, $PbTiO_3$, $Bi_4Ti_3O_{12}$, $SnTiO_3$, $PbZrO_3$, $NaNbO_3$, $KNbO_3$, and mixtures containing them as a major component can be used. In addition, a mixture of such a ceramic dielectric with one of glass materials as enumerated above can also be used. Meanwhile, organic dielectric materials, such as polystyrene, polyethylene, polyethylene terephthalate, polycarbonate, polytetrafluoroethylene, polypropylene, cellulose triacetate, poly-para-xylene, polyurethane, and mixtures thereof can be used. Also, a mixture of such an organic dielectric material with one of the above ceramic dielectrics can be used. The dielectric layer 4 can be formed by coating and sintering a composition paste mainly containing a dielectric material, or by adhering film sheets.

Figure 3:
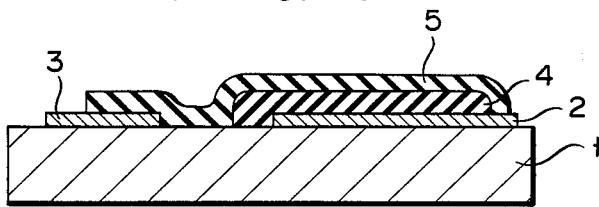

As shown in FIG. 3, a layer 5 made of an insulating composition according to the present invention is formed so as to cover the dielectric layer 4 and the electrode 3. Thus, the dielectric layer 4 is protected by the insulating layer 5. When any one of the organic polymeric material which contains a metal source, the thick film paste, and the organic polymeric material which is carbonized by heating is used as the insulating composition, the composition is preferably applied by screen printing. After application, the composition is appropriately dried, thus obtaining the desired insulating layer 5.

Figure 4:
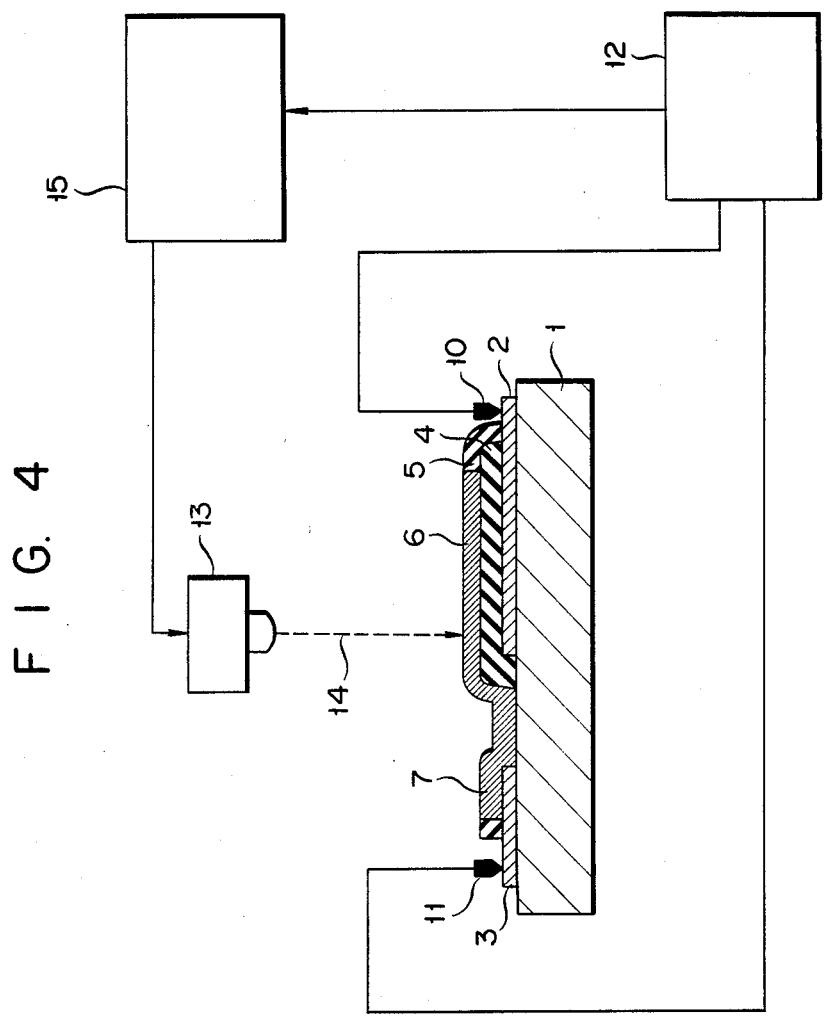

As shown in FIG. 4, probes 10 and 11 are brought into contact with an exposed portion of the first electrode 2 and the capacitance measuring electrode 3, respectively. The probes 10 and 11 are connected to a capacitance measuring device 12. In order to locally convert the insulating composition layer 5 into a conductor (or second electrode of the capacitor) 6, a laser beam 14 is used as a heat source. The ON/OFF and scanning operations of the laser beam 14 are controlled by a computer control system 15 connected to the capacitance measuring device 12. The scanning operation of the laser beam 14 can be performed by deflecting the laser beam itself or by moving the substrate on an X-Y stage.

In FIG. 4, the laser beam 14 is irradiated on the insulating composition layer 5 on the electrode 3 so as to locally convert it into a conductor, thus forming a conductor end portion 7 for measuring the capacitance. Subsequently, the laser beam 14 scans toward the dielectric layer 4, and the insulating composition layer 5 is sequentially converted into the conductor 6 so that the electrode 3 is connected to the dielectric layer 4 by means of a conductor path. Thereafter, the area of the insulating composition layer 5 on the dielectric layer irradiated by the laser beam 14 is gradually increased, thus increasing an area of the second electrode 6 on the dielectric layer 4. A change in the capacitance in accordance with an increase in the area of the second electrode 6 is measured by the capacitance measuring device 12. When the capacitance reaches a predetermined value, the computer control system 15 supplies an OFF signal to a laser beam generator 13 in response to a signal from the capacitance measuring device 12.

Figure 5:
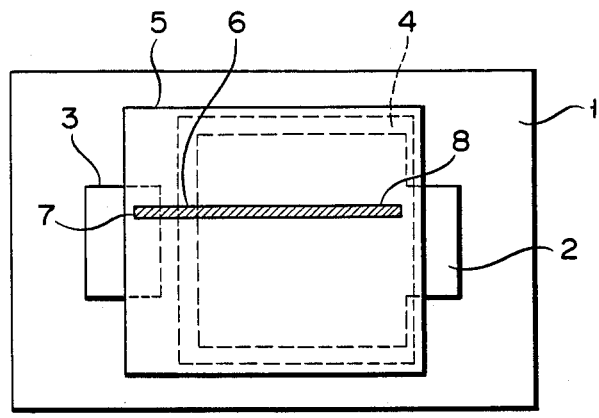
FIGS. 5 and 6 are schematic plan views for explaining processes for locally heating an insulating composition to convert it into a conductor while measuring a capacitance.
Figure 6:
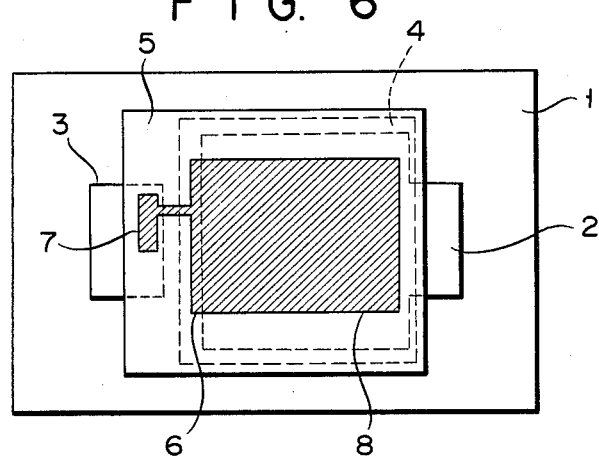

FIGS. 5 and 6 are enlarged plan views of a heated region of the insulating composition sequentially showing the states wherein an area of the conductor region 6 including the conductor end portion 7 and a second electrode 8 is increased. In FIG. 5, the laser beam is irradiated on a portion of the insulating composition layer 5 on the electrode 3, and the irradiated portion is converted into the conductor end portion 7 for measuring the capacitance. When the laser beam scans toward the first electrode 2, the conductor region 6 is continuously formed in a strip manner. A portion of the conductive region 6 on the dielectric layer 4 serves as the second electrode 8. FIG. 6 shows the state wherein an area of the second electrode 8 is further increased by laser beam scanning than the state of FIG. 5. As shown in FIG. 6, when the region of the conductor end portion 7 is enlarged by scanning the laser beam, the end portion 7 and the electrode 3 can provide a good contact.

In the above embodiment, an example in which the electrode 3 for measuring the capacitance is provided has been described. However, as described above, the electrode 3 can be omitted and a probe 11 can be brought into direct contact with the conductor end portion 7 for measuring the capacitance.

Resistors and conductors such as conductor paths which are formed by a method according to the present invention may have a low mechanical strength. Therefore, as in a conventional method, after forming the conductor, a protection layer can be formed. However, the process of forming the protection layer undesirably affects the conductor, resulting in disconnection, a change in resistance, and the like. For this reason, the protection layer is preformed on the insulating composition layers and thereafter heat waves are irradiated through this protection layer on the insulating composition layer, thereby resolving the above problem. In other words, heat waves are irradiated through a protection layer 9 and a portion which is converted into the conductor 6 from the insulating composition layer 5 is not directly exposed to atmosphere (see FIG. 7).

A material of the protection layer can be a material which transmits without absorbing the heat energy of the laser beam and the like, and includes materials having good transparency such as acrylic resin, melamine resin, phenolic resin, diallyl phthalate resin, polystyrene resin, epoxy resin, polyester resin, and the like. These resins can be directly coated on the insulating composition layer or laminated thereon. In addition, an inorganic transparent material such as a glass plate can be formed on the layer.

A thickness of the protection layer is not limited. However, good adhesion between the insulating composition layer and the conductor layer formed must be maintained. If the protection layer is too thick, heat waves can be undesirably absorbed. This is especially a problem when the insulating composition layer contains a black colorant which easily absorbs the heat waves.

In this manner, according to the method in which the heat waves are irradiated on the underlying insulating composition layer so as to form the conductor after forming the protection layer, a capacitor having a good mechanical strength and reliability can be obtained.

The present invention will be described by way of examples hereinafter.

EXAMPLE 1

A 96% alumina ceramic substrate (50×50×0.635 m/m) (available from KYOCERA CORP) was used as an insulating substrate. An Ag/Pd paste (Dupont 9843) was screen-printed on the substrate and was dried at a temperature of 150° C. for 10 minutes. Thereafter, the resultant structure was sintered for 45 minutes in a heating cycle having a peak temperature of 850° C. held for 10 minutes, thereby forming a first electrode 2 and an electrode 3 for measuring a capacitance, as shown in FIG. 1. A dielectric paste having the following content was screen-printed on the resultant structure and dried at a temperature of 150° C. for 10 minutes.

SiO2: 25 parts by weight
PbO: 20 parts by weight
B2O3: 15 parts by weight
Polyvinyl alcohol: 10 parts by weight
Butyl carbitol: 20 parts by weight Thereafter, the resultant structure was sintered for 45 minutes in a heating cycle having a peak temperature of 650° C. held for 10 minutes, thus forming the dielectric layer 4, as shown in FIG. 2.

Furthermore, an organic insulating paste composition was screen-printed on the resultant structure, as shown in FIG. 3 to form the insulating composition layer 5. The composition contained 65 parts by weight of a copper powder having an average particle size of 0.1 to 1.0 μm, 35 parts by weight of acrylic resin "Alon S409O" (available from Toa Gosei K.K.) and N-butyl carbitol. Then, the resultant structure was dried at a temperature of 120° C. for 30 minutes.

Thereafter, a laser beam with a beam output of 6 W, a scanning speed of 20 mm/sec and a beam diameter of 50 μm, was irradiated from a YAG lasing apparatus (LAY-711 available from TOSHIBA) in a nitrogen atmosphere on the insulating composition layer 5 so as to form a conductor 6 while measuring a capacitance between the electrodes 2 and 3 by using an "YHP 4275A" multi LCR meter (available from YOKOGAWA-HEWLETT PACKARD, LTD), thereby forming the second electrode. At this time, the capacitor measuring device was operated in synchronism with the lasing apparatus. The measuring device was programmed in such a manner that when the measured capacitance reached a predetermined value, the laser beam was stopped.

Characteristics of the obtained film capacitor (sample Nos. 1–3) are shown in Table 1 below.

TABLE 1

| Sample No. | Thickness of dielectric material (μ) | Preset capacitance | Measured value | Error (%) |
| --- | --- | --- | --- | --- |
| 1 | 13 | 400 pF | 403 pF | +0.75 |
| 2 | 13 | 300 pF | 301 pF | +0.3 |
| 2 | 13 | 200 pF | 202 pF | +1.0 |

Areas on the second electrode of the film capacitors shown in this example were respectively 107 mm² (sample No. 1), 80 mm² (sample No. 2) and 53 mm² (sample No. 3). A dielectric constant calculated from these values was $\epsilon = 5.6$. In this manner, according to the present invention, a film capacitor can be formed to a precision within 1% of a desired preset capacitance.

EXAMPLE 2

A glass epoxy substrate was used as an insulating substrate 1. This substrate was a so-called G-10, and had a copper foil of 35μ thickness. The copper foil was selectively removed by etching so as to form electrodes 2 and 3. A paste containing 20 parts by weight of polycarbonate resin, and 80 parts by weight of a solvent mixture of cyclohexanone and N-butyl carbitol was used as the dielectric material and was screen-printed on the resultant structure. Thereafter, the structure was hardened at a temperature of 150° C. for 30 minutes, thereby forming a dielectric film.

Subsequently, 20 parts by weight of copper acetate and 60 parts by weight of polymethyl methacrylate were dissolved in N,N-dimethylformamide, thereby obtaining a resin composition containing an organic metal-containing resin (organic insulating material). The obtained organic insulating material was screen-printed on the structure and dried at a temperature of 100° C. for 30 minutes, thereby forming an insulating composition layer 5. The insulating composition layer 5 was scanned by a laser beam with a spot diameter of 50μ and an output of 6 W generated from a "LAY-711" YAG lasing apparatus, thereby forming a conductor 6. Simultaneously, a capacitance between the electrodes 2 and 3 was measured by using an "YHP 4275A" multi LCR meter.

As a result, a film capacitor (sample No. 4–7) with the characteristics shown in Table 2 was obtained.

TABLE 2

| Sample No. | Thickness of dielectric material (μ) | Preset capacitance | Measured value | Error (%) |
|---|---|---|---|---|
| 4 | 20 | 150 pF | 152 pF | 1.3 |
| 5 | 22 | 100 pF | 102 pF | 2.0 |
| 6 | 20 | 80 pF | 81 pF | 1.25 |
| 7 | 25 | 50 pF | 51 pF | 2.0 |

In this manner, according to the present invention, a film capacitor can be formed to a precision within 2.0% with respect to a target value.

EXAMPLE 3

Figure 7:
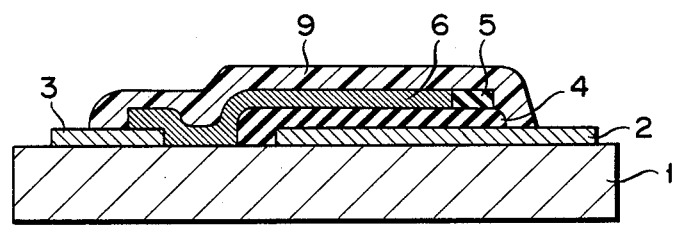
FIG. 7 is a sectional view schematically showing a capacitor having a protection layer on a second electrode produced by the method of the present invention.

Although Example 3 had the same structure as in Example 1, a protection layer 9 made of an acrylic resin was formed as an overlying layer and a YAG layer beam was irradiated, thus forming a capacitor (FIG. 7). Irradiation conditions of the laser beam were the same as those of Example 1. Characteristics of the obtained film capacitor as shown in Table 3 below.

TABLE 3

| Sample No. | Thickness of dielectric material (μm) | Preset capacitance | Measured value | Error (%) | Changes over time (%) (*) |
|---|---|---|---|---|---|
| 8 | 14 | 200 pF | 202 pF | 1.0 | +2.2 |
| 9 | 13 | 250 pF | 252 pF | 0.8 | +1.8 |
| 10 | 14 | 300 pF | 303 pF | 1.0 | +0.5 |
| 11 | 14 | 350 pF | 355 pF | 1.0 | +0.7 |
| 12 | 13 | 400 pF | 406 pF | 1.5 | +1.2 |

(*)a change in a capacitance after 1,000 hours at 85° C. ± 3° C.

In this manner, a capacitor having stable characteristics was obtained.

What is claimed is:

1. A method for producing a capacitor, comprising the steps of:
    (1) forming a dielectric layer on a first electrode so as to expose an end portion of said first electrode;
    (2) forming on said dielectric layer an insulating composition layer which can be rendered conductive by heating with heat waves;
    (3) locally heating said insulating composition layer so as to form a conductor end portion for measuring a capacitance; and
    (4) locally and gradually heating said insulating composition layer until a capacitance thereof reaches a predetermined value while measuring the capacitance between said exposed end portion of said first electrode and said conductor end portion for measuring the capacitance, thereby forming a second electrode which is conductive.

2. A method according to claim 1, wherein a capacitance measuring electrode is formed at the same time as said first electrode on an insulating substrate so as to be apart from said dielectric layer, said insulating composition layer is formed so as to cover said capacitance measuring electrode and said dielectric layer, and said conductor end portion is formed by heating on said capacitance measuring electrode.

3. A method according to claim 1, wherein said insulating composition layer is made of a material selected from the group consisting of an organic polymeric compound containing one of a metal powder and an organometallic compound as a metal source; a thick film paste containing a metal oxide and an organic binder; and an organic polymeric compound which increases a conductivity thereof by carbonizing as a result of heating.

4. A method according to claim 3, wherein the organic polymeric compound containing the metal powder as the metal source contains 5 to 35% by volume of the metal powder.

5. A method according to claim 4, wherein an average particle size of the metal powder is not more than 2,000 Å.

6. A method according to claim 3, wherein the organometallic compound is a material selected from the group consisting of metal formates; metal acetates; metal acrylates acid and methacrylates, and polymers thereof; metal alkylates having 1 to 5 carbon atoms; and metal alkoxylates having 1 to 5 carbon atoms.

7. A method according to claim 3, wherein said insulating composition layer containing the organic polymeric compound which contains the organometallic compound as the metal source has a metallic atom content of about 0.1 to 20%.

8. A method according to claim 1, wherein a laser beam or focused infrared rays are used as a heating source for converting said insulating composition layer into a conductor.

* * * * *